(12) United States Patent
Fukuda et al.

(10) Patent No.: US 11,415,752 B2
(45) Date of Patent: Aug. 16, 2022

(54) OPTICAL INSPECTION CIRCUIT

(71) Applicant: Nippon Telegraph and Telephone Corporation, Tokyo (JP)

(72) Inventors: Hiroshi Fukuda, Tokyo (JP); Toru Miura, Tokyo (JP); Yoshiho Maeda, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 2 days.

(21) Appl. No.: 17/057,057

(22) PCT Filed: May 14, 2019

(86) PCT No.: PCT/JP2019/019129
§ 371 (c)(1),
(2) Date: Nov. 19, 2020

(87) PCT Pub. No.: WO2019/230372
PCT Pub. Date: Dec. 5, 2019

(65) Prior Publication Data
US 2021/0181426 A1     Jun. 17, 2021

(30) Foreign Application Priority Data
May 29, 2018    (JP) .............................. JP2018-102097

(51) Int. Cl.
*G02B 6/34*     (2006.01)
*G02B 6/12*     (2006.01)
(Continued)

(52) U.S. Cl.
CPC ........... *G02B 6/34* (2013.01); *G02B 6/12002* (2013.01); *G02B 6/12004* (2013.01);
(Continued)

(58) Field of Classification Search
CPC .. G02B 6/34; G02B 6/12002; G02B 6/12004; G02B 6/124; G02B 6/4206; G02B 6/30;
(Continued)

(56) References Cited

U.S. PATENT DOCUMENTS

| | | | |
|---|---|---|---|
| 6,859,587 B2 * | 2/2005 | Nikonov | G01M 11/37 385/14 |
| 7,378,861 B1 * | 5/2008 | Malendevich | G02B 6/124 324/750.23 |

(Continued)

FOREIGN PATENT DOCUMENTS

| | | |
|---|---|---|
| WO | 2014034238 A1 | 3/2014 |
| WO | 2014034655 A1 | 3/2014 |
| WO | 2016194349 A1 | 12/2016 |

*Primary Examiner* — Ellen E Kim
(74) *Attorney, Agent, or Firm* — Slater Matsil, LLP

(57) ABSTRACT

An optical inspection circuit includes an optical circuit to be inspected formed on a substrate, an input optical waveguide optically connected to the optical circuit, and an output optical waveguide optically connected to the optical circuit. The input optical waveguide is connected with a grating coupler for input. The grating coupler is connected with the input optical waveguide via a spot size conversion unit. The output optical waveguide is optically connected with a photodiode.

11 Claims, 5 Drawing Sheets

(51) Int. Cl.
 *G02B 6/124* (2006.01)
 *G02B 6/42* (2006.01)
 *H01L 31/0232* (2014.01)
 *H01L 31/10* (2006.01)

(52) U.S. Cl.
 CPC ........... *G02B 6/124* (2013.01); *G02B 6/4206* (2013.01); *H01L 31/02327* (2013.01); *H01L 31/10* (2013.01)

(58) Field of Classification Search
 CPC .... G02B 2006/12107; H01L 31/02327; H01L 31/10
 See application file for complete search history.

(56) References Cited

U.S. PATENT DOCUMENTS

| 10,365,435 | B1* | 7/2019 | Karimelahi | ............ G02B 6/126 |
| 2015/0211960 | A1 | 7/2015 | Shimizu | |
| 2015/0214122 | A1 | 7/2015 | Vermeulen et al. | |
| 2015/0247779 | A1 | 9/2015 | Okamoto | |
| 2016/0246009 | A1* | 8/2016 | Jiang | ...................... G02B 6/124 |
| 2018/0143376 | A1 | 5/2018 | Kamei et al. | |
| 2019/0280146 | A1* | 9/2019 | Baudot | ............. H01L 31/02327 |

* cited by examiner

OPTICAL INSPECTION CIRCUIT

CROSS-REFERENCE TO RELATED APPLICATIONS

This application is a national phase entry of PCT Application No. PCT/JP2019/019129, filed on May 14, 2019, which claims priority to Japanese Application No. 2018-102097, filed on May 29, 2018, which applications are hereby incorporated herein by reference.

TECHNICAL FIELD

The present invention relates to an optical inspection circuit for inspecting optical circuits.

BACKGROUND

In inspection of optical circuits, light is input and a response to the input light is measured. In order to cope with an increase in communication volume, wavelength multiplexing is essential, which requires precise inspection in a wide optical wavelength range. Silicon photonics devices have been drawing attention to make devices more economical. Introduction of silicon photonics can reduce manufacturing costs, but in order to drastically reduce the costs, reduction of inspection costs is necessary, and sophistication of wafer level inspection is required.

In the wafer level inspection, a grating coupler is used for light input. However, since the grating coupler has a wavelength characteristic (wavelength dependency) of a light transmission intensity characteristic as shown in FIG. 9, it is difficult to apply it to evaluation (inspection) in the wide optical wavelength range.

Also in the wafer level inspection, in order to simulate input and output from/to an edge coupler, a configuration in which the edge coupler and the grating coupler are combined has been proposed (see Patent Literature 1). This advanced technique will be described with reference to FIG. 10. This configuration first includes an optical circuit 202 to be inspected composed of an optical waveguide with a core made of a semiconductor, an input optical waveguide 203 composed of an optical waveguide with a core made of the semiconductor and optically connected to the optical circuit 202, and an output optical waveguide 204 composed of an optical waveguide with a core made of the semiconductor and optically connected to the optical circuit 202.

The input optical waveguide 203 is connected to a grating coupler 205 for input. The grating coupler 205 for input is connected to the input optical waveguide 203 via a spot size conversion unit 206. The spot size conversion unit 206 includes a first optical waveguide unit 211 that is disposed continuously to the input optical waveguide 203 and has the same cross-sectional size as the core of the input optical waveguide 203 at a connection point with the core of the input optical waveguide 203, and a second optical waveguide unit 212 that is disposed continuously to the first optical waveguide unit 211 and has a core, a cross-sectional size of the core increasing as distance from the first optical waveguide unit 211 increases.

The output optical waveguide 204 is connected to a grating coupler 207 for output. The grating coupler 207 for output is connected to the output optical waveguide 204 via a spot size conversion unit 208. The spot size conversion unit 208 includes a first optical waveguide unit 213 that is disposed continuously to the output optical waveguide 204 and has the same cross-sectional size as the core of the output optical waveguide 204 at a connection point with the core of the output optical waveguide 204, and a second optical waveguide unit 214 that is disposed continuously to the first optical waveguide unit 213 and has a core, a cross-sectional size of the core increasing as distance from the first optical waveguide unit 213 increases.

In the optical inspection circuit described above, light from an input optical fiber 221 is input to the grating coupler 205 for input and reaches the spot size conversion unit 206. Then, the input light is input to the optical circuit 202 via the input optical waveguide 203. Light output from the optical circuit 202 reaches the spot size conversion unit 208 via the output optical waveguide 204. Then, the light output is output toward an output optical fiber 222 by the grating coupler 207 for output. By comparing and analyzing the light input to the input optical fiber 221 and the light output from the output optical fiber 222, a characteristic of the optical circuit 202 can be inspected.

CITATION LIST

Patent Literature

Patent Literature 1: US 2015/0214122.

SUMMARY

Technical Problem

However, since the conventional technique described above uses grating couplers at both input and output, there is a problem that the wavelength characteristics of the grating couplers are more emphasized, which makes it difficult to inspect the device characteristic. In the technique, there also is a problem that two optical fibers for input and output require alignment with the respective two grating couplers, which makes it to take a longer time for inspection.

Embodiments of the present invention have been made to solve the problems described above, and an object of embodiments of the present invention is to allow inspection of an optical circuit over a wider optical wavelength range to be performed in a shorter time.

Means for Solving the Problem

An optical inspection circuit according to embodiments of the present invention includes an optical circuit composed of an optical waveguide with a core made of a semiconductor formed on a substrate, an input optical waveguide composed of an optical waveguide with a core made of the semiconductor and optically connected to the optical circuit, an output optical waveguide composed of an optical waveguide with a core made of the semiconductor and optically connected to the optical circuit, a grating coupler formed on the input optical waveguide via a spot size conversion unit, and a photodiode optically connected to the output optical waveguide.

In the optical inspection circuit described above, the spot size conversion unit includes a first optical waveguide unit that is disposed continuously to the input optical waveguide and has the same cross-sectional size as the core of the input optical waveguide, and a second optical waveguide unit that is disposed continuously to the first optical waveguide unit and has a core, a cross-sectional size of the core increasing as distance from the first optical waveguide unit increases, and the first optical waveguide unit is formed crossing a cutting region for cutting the optical circuit into a chip from the substrate. For example, a width of the cutting region is made 10 µm or more.

In the optical inspection circuit, the semiconductor is silicon, and the photodiode is a germanium photodiode.

Effects of Embodiments of the Invention

As described above, according to embodiments of the present invention, the photodiode is connected to the output optical waveguide of the optical circuit, and hence it is possible to obtain an excellent effect that inspection of the optical circuit over a wider optical wavelength range can be performed in a shorter time.

DETAILED DESCRIPTION OF ILLUSTRATIVE EMBODIMENTS

Hereinafter, optical inspection circuits according to embodiments of the present invention will be described.

Embodiment 1

Figure 1:
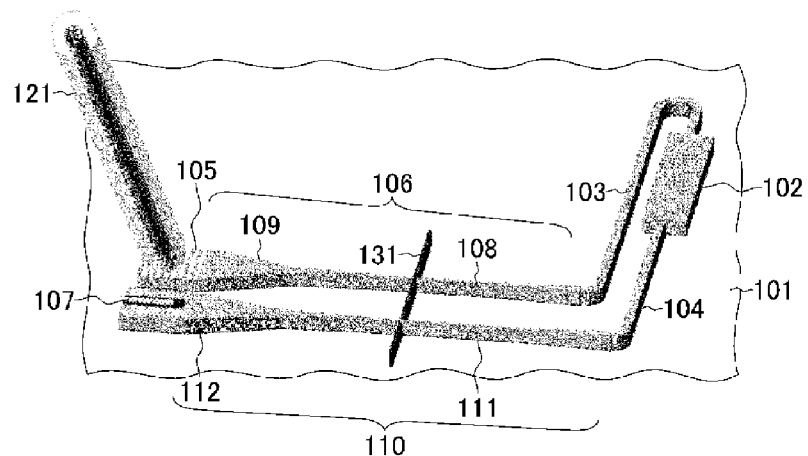
FIG. 1 is a perspective view showing a configuration of an optical inspection circuit according to Embodiment 1 of the present invention.

First, an optical inspection circuit according to Embodiment 1 of the present invention will be described with reference to FIG. 1. This optical inspection circuit first includes an optical circuit 102 to be inspected formed on a substrate 101, an input optical waveguide 103 optically connected to the optical circuit 102, and an output optical waveguide 104 optically connected to the optical circuit 102.

The substrate 101 is, for example, a well-known SOI (Silicon On Insulator) substrate. The optical circuit 102, the input optical waveguide 103, and the output optical waveguide 104 are composed of an optical waveguide including a core formed by patterning a surface silicon layer (semiconductor) of the SOI substrate and a buried insulating layer as a cladding. In this way, the optical circuit 102 composed of the optical waveguide having the core made of silicon can be manufactured by a well-known silicon photonics technique.

The input optical waveguide 103 is connected with a grating coupler 105 for input. The grating coupler 105 is connected with the input optical waveguide 103 via a spot size conversion unit 106. The spot size conversion unit 106 includes a first optical waveguide unit 108 that is disposed continuously to the input optical waveguide 103 and has the same cross-sectional size as the core of the input optical waveguide 103, and a second optical waveguide unit 109 that is disposed continuously to the first optical waveguide unit 108 and has a core, a cross-sectional size of the core increasing as distance from the first optical waveguide unit 108 increases. In this example, the core of the first optical waveguide unit 108 is made to have the same cross-sectional size as the core of the input optical waveguide 103 at a connection point with the input optical waveguide 103. In this example, the core of the first optical waveguide unit 108 has a region where it is thinner than the core of the input optical waveguide 103 in a region closer to the second optical waveguide unit 109.

On the other hand, the output optical waveguide 104 is optically connected with a photodiode 107. In Embodiment 1, the photodiode 107 is connected with the output optical waveguide 104 via a spot size conversion unit 110. The photodiode 107 is, for example, a well-known germanium photodiode.

The spot size conversion unit 110 includes a first optical waveguide unit 111 that is disposed continuously to the output optical waveguide 104 and has the same cross-sectional size as the core of the output optical waveguide 104, and a second optical waveguide unit 112 that is disposed continuously to the first optical waveguide unit 11 and has a core, a cross-sectional size of the core increasing as distance from the first optical waveguide unit 11 increases. In this example, the core of the first optical waveguide unit 11 is made to have the same cross-sectional size as the core of the output optical waveguide 104 at a connection point with the output optical waveguide 104. In this example, the core of the first optical waveguide unit 11 has a region where it is thinner than the core of the output optical waveguide 104 in a region closer to the second optical waveguide unit 112.

In the optical inspection circuit according to Embodiment 1, light from an input optical fiber 121 is input to the grating coupler 105 and reaches the spot size conversion unit 106. Then, the input light is input to the optical circuit 102 via the input optical waveguide 103. Light output from the optical circuit 102 is guided through the output optical waveguide 104 and, in Embodiment 1, is input to the photodiode 107 via the spot size conversion unit 110.

The photodiode 107 converts the input light into current. Photocurrent can be measured by connecting a voltage source and an ammeter to the photodiode 107 and applying an appropriate reverse voltage of, for example, −2 V. When the photocurrent is measured in synchronization with the wavelength of the input light, a photocurrent spectrum can be obtained by using the photodiode 107. By comparing and analyzing the light input via the grating coupler 105 and the photocurrent output from the photodiode 107, a characteristic of the optical circuit 102 can be inspected.

Figure 2:
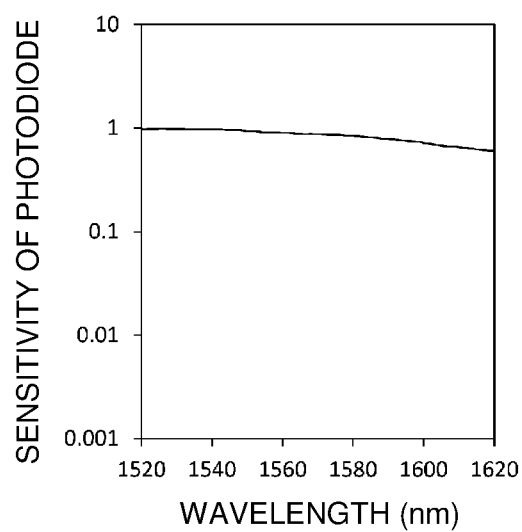
FIG. 2 is a characteristic diagram showing a wavelength characteristic of sensitivity of a germanium photodiode.
Figure 9:
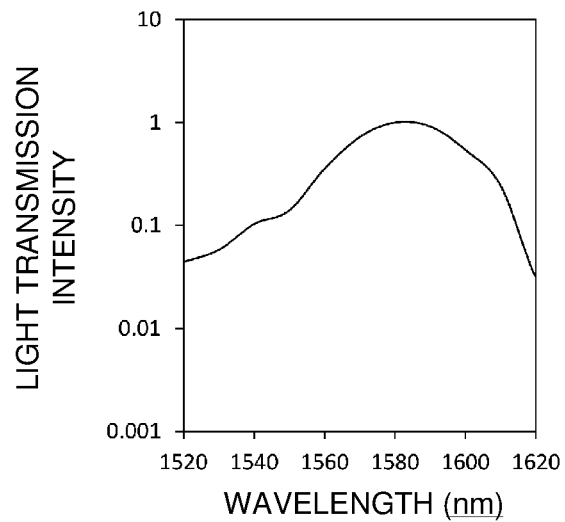
FIG. 9 is a characteristic diagram showing a wavelength characteristic of a light transmission intensity characteristic of a grating coupler.
Figure 10:
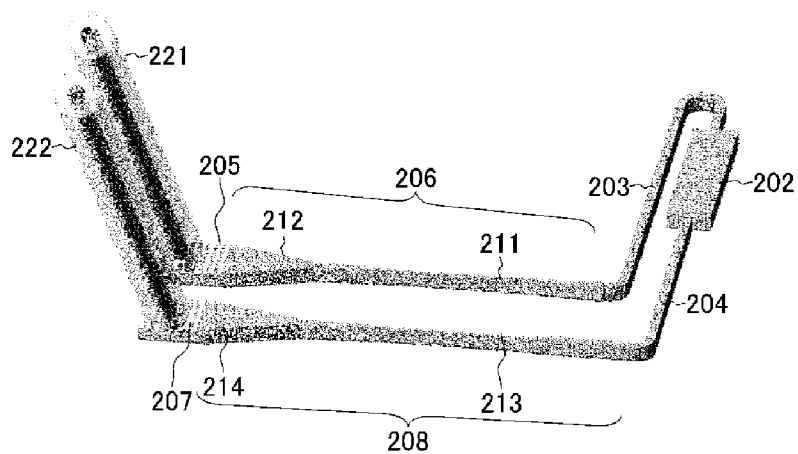
FIG. 10 is a perspective view showing a configuration of a traditional optical inspection circuit

As described above, embodiments of the present invention are characterized in that the light output from the optical circuit 102 is detected by the photodiode 107 formed on the same substrate 101. A wavelength characteristic (dependency) of sensitivity of a germanium photodiode, which is a representative photodiode used in silicon photonics, is shown in FIG. 2. It can be seen that the wavelength dependency is smaller than the characteristic of the grating coupler described with reference to FIG. 9 and embodiments of the present invention is suitable to grasp the characteristic of the optical circuit 102. In addition, embodiments of the present invention uses the grating coupler 105 only on the input side, and there is no need for the alignment with the optical fiber on the output side.

Figure 3:
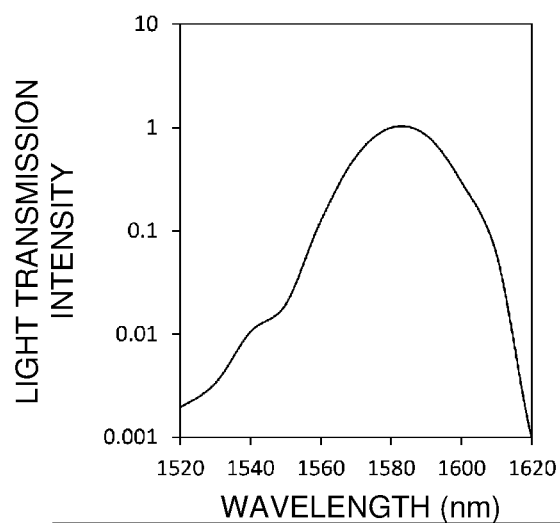
FIG. 3 is a characteristic diagram showing a transmission spectrum when light passes through two grating couplers connected in series.
Figure 4:
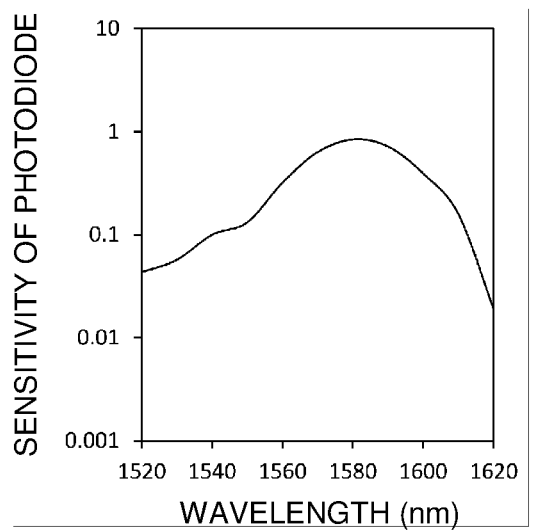
FIG. 4 is a characteristic diagram showing a photocurrent spectrum when light passes through in a configuration in which one grating coupler and one germanium photodiode are connected in series.

FIG. 3 shows a transmission spectrum when light passes through two grating couplers connected in series. In this case, a wavelength region where optical intensity becomes $\frac{1}{10}$ of peak intensity is about 50 nm. Next, FIG. 4 shows a photocurrent spectrum when light passes through in a configuration in which one grating coupler and one germanium photodiode are connected in series. In this case, a wavelength region where a current value becomes $\frac{1}{10}$ of a peak current is about 75 nm.

As is apparent from the above-mentioned two comparisons, according to embodiments of the present invention, it is possible to obtain an excellent effect that the wavelength characteristic of the optical circuit can be inspected in a wide range of about 1.5 times in the wafer level inspection of the optical circuit such as silicon photonics. In addition, according to embodiments of the present invention, since the alignment with the optical fiber can be omitted on the output side, it is possible to obtain an excellent effect that a time required for the alignment with the optical fiber can be made about ½, and inspection of the optical circuit can be performed in a shorter time.

After inspecting at the wafer level as described above, by cutting (dicing) the optical circuit 102 from the substrate 101 along a cutting line 131 for cutting into a chip, the chip of a region of the optical circuit 102 is cut out. If the first optical waveguide unit 11 of the spot size conversion unit 106 is formed so as to cross the cutting line 131, the spot size conversion unit 106 will have a light input function from an end face of the cut-out chip. In Embodiment 1, the same applies to the spot size conversion unit 110.

Blade dicing is generally used for such cut-out of a chip, but in this case, a problem such as pitching of the cut end face may arise. The pitching can be eliminated by optically polishing the cut end face. Optical polishing allows a stable light input function to be obtained at the cut end face. Therefore, the first optical waveguide unit 111 is preferably formed to have a length that crosses the cutting line 131 and also crosses a cutting region including the polishing region described above. About 10 μm of the optical polishing may be sufficient, so that a width of the cutting region is 10 μm or more. When the chip is cut out by stealth dicing, a stable light input function can be obtained without using optical polishing.

Embodiment 2

Figure 5:
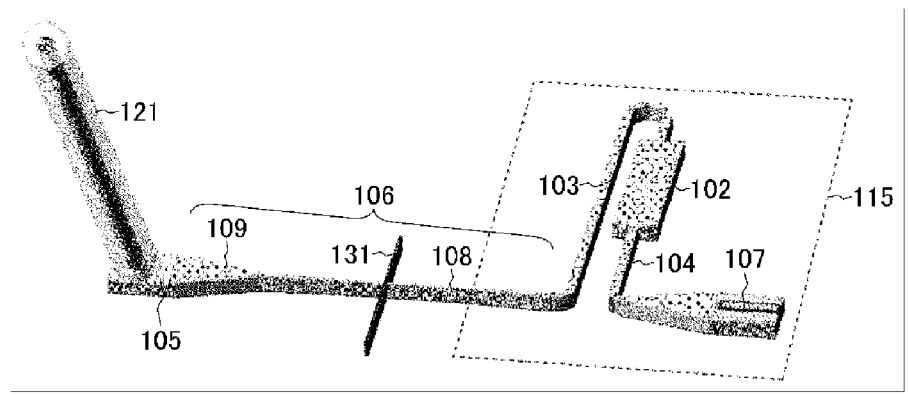
FIG. 5 is a perspective view showing a configuration of an optical inspection circuit according to Embodiment 2 of the present invention.

Next, an optical inspection circuit according to Embodiment 2 of the present invention will be described with reference to FIG. 5. This optical inspection circuit first includes an optical circuit 102 to be inspected formed on a substrate (not shown), an input optical waveguide 103 optically connected to the optical circuit 102, and an output optical waveguide 104 optically connected to the optical circuit 102.

The substrate is, for example, a well-known SOI substrate. The optical circuit 102, the input optical waveguide 103, and the output optical waveguide 104 are composed of an optical waveguide including a core formed by patterning a surface silicon layer of the SOI substrate and a buried insulating layer as a cladding.

The input optical waveguide 103 is connected with a grating coupler 105 for input. The grating coupler 105 is connected with the input optical waveguide 103 via a spot size conversion unit 106. A first optical waveguide unit 11 of the spot size conversion unit 106 is formed crossing a cutting line 131. The configurations are the same as those of Embodiment 1 described above.

Also in Embodiment 2, the output optical waveguide 104 is optically connected with a photodiode 107. The photodiode 107 is formed in a chip region 115 which is to be made into a chip. Note that the photodiode 107 is, for example, a well-known germanium photodiode. In Embodiment 2, when the chip region 115 is cut out by dicing along the cutting line 131, the chip region 115 includes the photodiode 107.

Also in the optical inspection circuit according to Embodiment 2, light from an input optical fiber 121 is input to the grating coupler 105 and reaches the spot size conversion unit 106. Then, the input light is input to the optical circuit 102 via the input optical waveguide 103. In Embodiment 2, light output from the optical circuit 102 is guided through the output optical waveguide 104 and input to the photodiode 107.

The photodiode 107 converts the input light into current. Photocurrent can be measured by connecting a voltage source and an ammeter to the photodiode 107 and applying an appropriate reverse voltage of, for example, −2 V. When the photocurrent is measured in synchronization with the wavelength of the input light, a photocurrent spectrum can be obtained by using the photodiode 107. By comparing and analyzing the light input via the grating coupler 105 and the photocurrent output from the photodiode 107, a characteristic of the optical circuit 102 can be inspected.

Also in Embodiment 2, after inspecting at the wafer level as described above, by cutting (dicing) along the cutting line 131 for cutting into chips, the chip region 115 with the optical circuit 102 disposed is cut out from the substrate. If the first optical waveguide unit 111 of the spot size conversion unit 106 is formed so as to cross the cutting line 131, the spot size conversion unit 106 will have a light input function from an end face of the cut-out chip. When the optical circuit 102 is, for example, an optical reception circuit, it can be used as a chip of the optical reception circuit by above-described cutting out.

Embodiment 3

Figure 6:
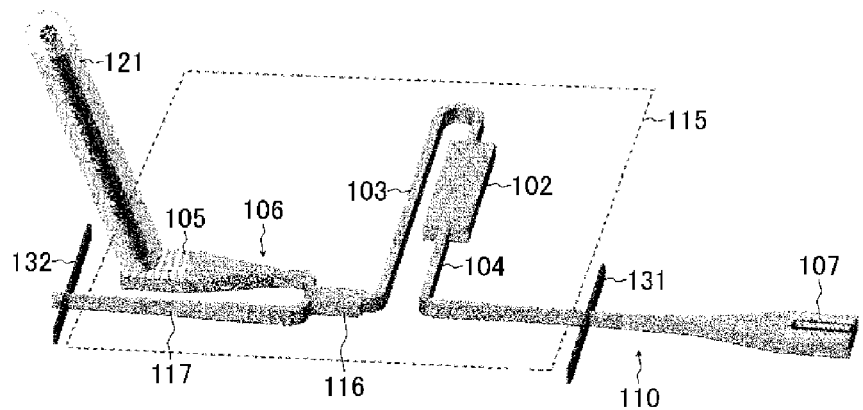
FIG. 6 is a perspective view showing a configuration of an optical inspection circuit according to Embodiment 3 of the present invention.

Next, an optical inspection circuit according to Embodiment 3 of the present invention will be described with reference to FIG. 6. This optical inspection circuit first includes an optical circuit 102 to be inspected formed on a substrate (not shown), an input optical waveguide 103 optically connected to the optical circuit 102, and an output optical waveguide 104 optically connected to the optical circuit 102.

The substrate is, for example, a well-known SOI substrate. The optical circuit 102, the input optical waveguide 103, and the output optical waveguide 104 are composed of an optical waveguide including a core formed by patterning a surface silicon layer of the SOI substrate and a buried insulating layer as a cladding.

The input optical waveguide 103 is connected with a grating coupler 105 for input. In Embodiment 3, the grating coupler 105 is connected with the input optical waveguide 103 via a spot size conversion unit 106 and a multiplex/demultiplex unit 116. The multiplex/demultiplex unit 116 is connected with the spot size conversion unit 106 connected with the grating coupler 105 and another spot size conversion unit 117. In Embodiment 3, the spot size conversion unit 117 is formed crossing a cutting line 132.

In Embodiment 3, the output optical waveguide 104 is optically connected with a photodiode 107 via a spot size conversion unit 110. The spot size conversion unit 110 is formed crossing a cutting line 131 and the photodiode 107 is formed outside a chip region 115.

In Embodiment 3, by dicing along the cutting line 131 and the cutting line 132, end faces formed by dicing of the spot size conversion unit 110 and the spot size conversion unit 117 are made into light input/output units.

Also in the optical inspection circuit according to Embodiment 3, light from an input optical fiber 121 is input to the grating coupler 105 and reaches the spot size conversion unit 106. Then, the input light is input to the optical circuit 102 via the multiplex/demultiplex unit 116 and the input optical waveguide 103. In Embodiment 3, light output from the optical circuit 102 is guided through the output optical waveguide 104 and the spot size conversion unit 110 and input to the photodiode 107.

The photodiode 107 converts the input light into current. Photocurrent can be measured by connecting a voltage source and an ammeter to the photodiode 107 and applying an appropriate reverse voltage of, for example, −2 V. When the photocurrent is measured in synchronization with the wavelength of the input light, a photocurrent spectrum can be obtained by using the photodiode 107. By comparing and analyzing the light input via the grating coupler 105 and the photocurrent output from the photodiode 107, a characteristic of the optical circuit 102 can be inspected.

Also in Embodiment 3, after inspecting at the wafer level as described above, by dicing along the cutting line 131 and the cutting line 132, the chip region 115 with the optical circuit 102 disposed is cut out from the substrate. If the spot size conversion unit 110 is formed so as to cross the cutting line 131, the spot size conversion unit 110 will have a light input function from an end face of the cut-out chip. In the same manner, if the spot size conversion unit 117 is formed so as to cross the cutting line 132, the spot size conversion unit 117 will have a light input function from an end face of the cut-out chip. When the optical circuit 102 is, for example, an optical reception circuit, it can be used as a chip of the optical reception circuit by above-described cutting out.

Embodiment 4

Figure 7:
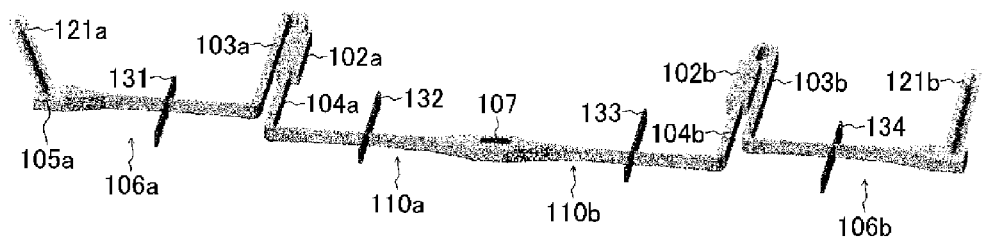
FIG. 7 is a perspective view showing a configuration of an optical inspection circuit according to Embodiment 4 of the present invention.
Figure 8:
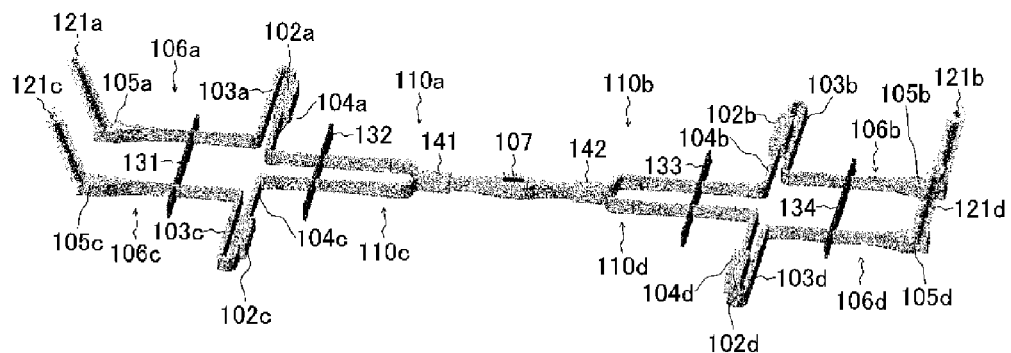
FIG. 8 is a perspective view showing a configuration of an optical inspection circuit according to Embodiment 5 of the present invention.

Next, an optical inspection circuit according to Embodiment 4 of the present invention will be described with reference to FIG. 7. This optical inspection circuit first includes optical circuits 102a and 102b to be inspected formed on a substrate (not shown), input optical waveguides 103a and 103b optically connected to the optical circuits 102a and 102b respectively, and output optical waveguides 104a and 104b optically connected to the optical circuits 102a and 102b respectively. In Embodiment 4, two sets of optical inspection circuits are formed on the substrate.

The input optical waveguides 103a and 103b are connected with grating couplers 105a and 105b for input, respectively. The grating couplers 105a and 105b are connected with the input optical waveguides 103a and 103b via spot size conversion units 106a and 106b, respectively.

On the other hand, the output optical waveguides 104a and 104b are optically connected with one photodiode 107. In Embodiment 4, the photodiode 107 is connected with the output optical waveguides 104a and 104b via the spot size conversion units 110a and 110b, respectively. In Embodiment 4, the one photodiode 107 is commonly used for the two sets of optical inspection circuits formed on the substrate.

In the optical inspection circuit according to Embodiment 4, light from an input optical fiber 121a is input to the grating coupler 105a and reaches the spot size conversion unit 106a. Then, the input light is input to the optical circuit 102a via the input optical waveguide 103a. Light output from the optical circuit 102a is guided through the output optical waveguide 104a and input to the photodiode 107 via the spot size conversion unit 110a.

In addition, light from an input optical fiber 121b is input to the grating coupler 105b and reaches the spot size conversion unit 106b. Then, the input light is input to the optical circuit 102b via the input optical waveguide 103b. Light output from the optical circuit 102b is guided through the output optical waveguide 104b and input to the photodiode 107 via the spot size conversion unit 110b.

The photodiode 107 converts the input light into current. Photocurrent can be measured by connecting a voltage source and an ammeter to the photodiode 107 and applying an appropriate reverse voltage of, for example, −2 V. When the photocurrent is measured in synchronization with the wavelength of the input light, a photocurrent spectrum can be obtained by using the photodiode 107. By comparing and analyzing the light input via the grating coupler 105a and the photocurrent output from the photodiode 107, a characteristic of the optical circuit 102a can be inspected. Furthermore, by comparing and analyzing the light input via the grating coupler 105b and the photocurrent output from the photodiode 107, a characteristic of the optical circuit 102b can be inspected.

As described above, according to Embodiment 4, the two optical circuits 102a and 102b are inspected with the one photodiode 107. Thereby, the number of photodiodes can be reduced. After inspecting at the wafer level, by dicing along cutting lines 131, 132, 133, and 134, the spot size conversion units 106a, 106b, 110a, and 110b can have a light input function from respective end faces. If chipping (crack) due to blade dicing becomes a problem, by optically polishing cross sections formed by dicing along the cutting lines 131, 132, 133, and 134, a stable light input function can be obtained. In addition, by stealth dicing, a stable light input function can be obtained without relying on optical polishing.

Embodiment 5

Next, an optical inspection circuit according to Embodiment 5 of the present invention will be described with reference to FIG. 7. This optical inspection circuit first includes optical circuits 102a, 102b, 102c, and 102d to be inspected formed on a substrate (not shown), input optical waveguides 103a, 103b, 103c, and 103d optically connected to the optical circuits 102a, 102b, 102c, and 102d respectively, and output optical waveguides 104a, 104b, 104c, and 104d optically connected to the optical circuits 102a, 102b, 102c, and 102d respectively. In Embodiment 5, four sets of optical inspection circuits are formed on the substrate.

The input optical waveguides 103a, 103b, 103c, and 103d are connected with grating couplers 105a, 105b, 105c, and 105d for input, respectively. The grating couplers 105a, 105b, 105c, and 105d are connected with the input optical waveguides 103a, 103b, 103c, and 103d via spot size conversion units 106a and 106b, respectively.

On the other hand, the output optical waveguides 104a, 104b, 104c, and 104d are optically connected with one photodiode 107. In Embodiment 5, the photodiode 107 is connected with the output optical waveguides 104a, 104b, 104c, and 104d via spot size conversion units 110a, 110b, 110c, and 110d, respectively. The spot size conversion unit 110a and the spot size conversion unit 110c are connected to the photodiode 107 via a multiplex/demultiplex unit 141, and the spot size conversion unit 110b and the spot size conversion unit nod are connected to the photodiode 107 via a multiplex/demultiplex unit 142. In Embodiment 5, the one photodiode 107 is commonly used for the four sets of optical inspection circuits formed on the substrate.

In the optical inspection circuit according to Embodiment 5, light from an input optical fiber 121a is input to the grating coupler 105a and reaches the spot size conversion unit 106a. Then, the input light is input to the optical circuit 102a via the input optical waveguide 103a. Light output from the optical circuit 102a is guided through the output optical waveguide 104a and input to the photodiode 107 via the spot size conversion unit 110a.

In addition, light from an input optical fiber 121b is input to the grating coupler 105b and reaches the spot size conversion unit 106b. Then, the input light is input to the optical circuit 102b via the input optical waveguide 103b. Light output from the optical circuit 102b is guided through the output optical waveguide 104b and input to the photodiode 107 via the spot size conversion unit 110b.

Furthermore, light from an input optical fiber 121c is input to the grating coupler 105c and reaches the spot size conversion unit 106c. Then, the input light is input to the optical circuit 102c via the input optical waveguide 103c. Light output from the optical circuit 102c is guided through the output optical waveguide 104c and input to the photodiode 107 via the spot size conversion unit 110c.

In addition, light from an input optical fiber 121d is input to the grating coupler 105d and reaches the spot size conversion unit 106d. Then, the input light is input to the optical circuit 102d via the input optical waveguide 103d. Light output from the optical circuit 102d is guided through the output optical waveguide 104d and input to the photodiode 107 via the spot size conversion unit 110d.

The photodiode 107 converts the input light into current. Photocurrent can be measured by connecting a voltage source and an ammeter to the photodiode 107 and applying an appropriate reverse voltage of, for example, −2 V. When the photocurrent is measured in synchronization with the wavelength of the input light, a photocurrent spectrum can be obtained by using the photodiode 107.

By comparing and analyzing the light input via the grating coupler 105a and the photocurrent output from the photodiode 107, a characteristic of the optical circuit 102a can be inspected. Furthermore, by comparing and analyzing the light input via the grating coupler 105b and the photocurrent output from the photodiode 107, a characteristic of the optical circuit 102b can be inspected.

By comparing and analyzing the light input via the grating coupler 105c and the photocurrent output from the photodiode 107, a characteristic of the optical circuit 102c can be inspected. Furthermore, by comparing and analyzing the light input via the grating coupler 105d and the photocurrent output from the photodiode 107, a characteristic of the optical circuit 102d can be inspected.

As described above, according to Embodiment 5, the four optical circuits 102a, 102b, 102c, and 102d are inspected with the one photodiode 107. Thereby, the number of photodiodes can be reduced. After inspecting at the wafer level, by dicing along cutting lines 131, 132, 133, and 134, the spot size conversion units 106a, 106b, 106c, 106d, 110a, 110b, 110c, and 110d can have a light input function from respective end faces.

If chipping due to blade dicing becomes a problem, by optically polishing cross sections formed by dicing along the cutting lines 131, 132, 133, and 134, a stable light input function can be obtained. In addition, by stealth dicing, a stable light input function can be obtained without relying on optical polishing.

As described above, according to the present invention, the photodiode is connected to the output optical waveguide of the optical circuit, so that inspection of the optical circuit over a wider optical wavelength range can be performed in a shorter time.

The present invention is not limited to the embodiments described above, and it is obvious that many modifications and combinations can be implemented by a person having ordinary knowledge in the art within the technical idea of the present invention. For example, in the above, the optical waveguide having the core made of silicon has been described as an example, but the present invention is not limited to this, and the same applies to an optical circuit composed of an optical waveguide having a core made of another semiconductor, for example, a III-V compound semiconductor. In this case, the photodiode should be composed of a compound semiconductor of the same type as the compound semiconductor forming the core.

REFERENCE SIGNS LIST

101 Substrate
102 Optical circuit
103 Input optical waveguide
104 Output optical waveguide
105 Grating coupler
106 Spot size conversion unit
107 Photodiode
108 First optical waveguide unit
109 Second optical waveguide unit
110 Spot size conversion unit
111 First optical waveguide unit
112 Second optical waveguide unit
121 Input optical fiber.

The invention claimed is:
1. An optical inspection circuit comprising:
an optical circuit comprising first optical waveguide, wherein a core of the first optical waveguide is made of a semiconductor on a substrate;
an input optical waveguide comprising a second optical waveguide, wherein a core of the second optical waveguide is made of the semiconductor, and wherein the input optical waveguide is optically connected to the optical circuit;
an output optical waveguide comprising of a third optical waveguide, wherein a core of the third optical waveguide is made of the semiconductor, and wherein the output optical waveguide is optically connected to the optical circuit;

a grating coupler connected to the input optical waveguide via a spot size converter, wherein the spot size converter comprises:
    a fourth optical waveguide disposed continuously to the input optical waveguide, a core of the fourth optical waveguide having a first cross-sectional size at a first point connected to the input optical waveguide, the core of the fourth optical waveguide having a second cross-sectional size at a second point farther from the input optical waveguide than the first point, the first cross-sectional size being a same cross-sectional size as the core of the second optical waveguide, the second cross-sectional size being thinner than the first cross-sectional size; and
    a fifth optical waveguide disposed continuously to the fourth optical waveguide, wherein a cross-sectional size of a core of the fifth optical waveguide increases as distance from the fourth optical waveguide increases; and
a photodiode optically connected to the output optical waveguide via a second spot size converter.

2. The optical inspection circuit according to claim 1, wherein the first optical waveguide crosses a cutting region for cutting the optical circuit into a chip from the substrate.

3. The optical inspection circuit according to claim 2, wherein a width of the cutting region is 10 μm or more.

4. The optical inspection circuit according to claim 1, wherein the semiconductor is silicon, and wherein the photodiode is a germanium photodiode.

5. A method comprising:
    forming an optical circuit comprising first optical waveguide on a substrate, wherein a core of the first optical waveguide is made of a semiconductor;
    forming an input optical waveguide one the substrate and comprising a second optical waveguide, wherein a core of the second optical waveguide is made of the semiconductor, and wherein the input optical waveguide is optically connected to the optical circuit;
    forming an output optical waveguide comprising of a third optical waveguide, wherein a core of the third optical waveguide is made of the semiconductor, and wherein the output optical waveguide is optically connected to the optical circuit;
    disposing a grating coupler on the input optical waveguide via a spot size converter, wherein the spot size converter comprises:
        a fourth optical waveguide disposed continuously to the input optical waveguide, a core of the fourth optical waveguide having a first cross-sectional size at a first point connected to the input optical waveguide, the core of the fourth optical waveguide having a second cross-sectional size at a second point farther from the input optical waveguide than the first point, the first cross-sectional size being a same cross-sectional size as the core of the second optical waveguide, the second cross-sectional size being thinner than the first cross-sectional size; and
        a fifth optical waveguide disposed continuously to the fourth optical waveguide, wherein a cross-sectional size of a core of the fifth optical waveguide increases as distance from the fourth optical waveguide increases; and
    forming a photodiode optically connected to the output optical waveguide via a second spot size converter.

6. The method according to claim 5, wherein the fourth optical waveguide crosses a cutting region of the substrate.

7. The method according to claim 6 further comprising cutting the optical circuit into a chip from the substrate along the cutting region, wherein cutting the optical circuit comprises cutting through the fourth optical waveguide on the substrate while the fourth optical waveguide is connected to the input optical waveguide and while the input optical waveguide is optically connected to the optical circuit.

8. The method according to claim 6, wherein a width of the cutting region is 10 μm or more.

9. The method according to claim 5, wherein the semiconductor is silicon, and wherein the photodiode is a germanium photodiode.

10. The optical inspection circuit according to claim 1, wherein the first optical waveguide further comprises a cladding made of a buried insulator layer, the buried insulator layer being disposed between the semiconductor and the substrate.

11. The optical inspection circuit according to claim 1, wherein the second spot size converter includes a sixth optical waveguide disposed continuously to the photodiode, wherein a cross-sectional size of a core of the sixth optical waveguide decreases as distance from the photodiode increases.

* * * * *